United States Patent
Walsh et al.

(10) Patent No.: US 10,417,354 B2
(45) Date of Patent: Sep. 17, 2019

(54) MODEL ORDER REDUCTION TECHNIQUE FOR DISCRETE FRACTURED NETWORK SIMULATION

(71) Applicant: SCHLUMBERGER TECHNOLOGY CORPORATION, Sugar Land, TX (US)

(72) Inventors: Dominic Walsh, Oxford (GB); Paul Woodhams, Abingdon (GB)

(73) Assignee: Schlumberger Technology corporation, Sugar Land, TX (US)

(*) Notice: Subject to any disclaimer, the term of this patent is extended or adjusted under 35 U.S.C. 154(b) by 567 days.

(21) Appl. No.: 14/535,510

(22) Filed: Nov. 7, 2014

(65) Prior Publication Data

US 2015/0169801 A1  Jun. 18, 2015

Related U.S. Application Data

(60) Provisional application No. 61/916,906, filed on Dec. 17, 2013.

(51) Int. Cl.
 *G06F 17/50* (2006.01)
 *G01V 99/00* (2009.01)

(52) U.S. Cl.
 CPC ........ *G06F 17/5009* (2013.01); *G01V 99/005* (2013.01); *G01V 2210/646* (2013.01)

(58) Field of Classification Search
 CPC .............. G06F 17/5009; G01V 99/005; G01V 2210/646
 See application file for complete search history.

(56) References Cited

U.S. PATENT DOCUMENTS

| | | | | |
|---|---|---|---|---|
| 5,446,908 A * | 8/1995 | Kevorkian | .............. | G06F 17/16 700/89 |
| 6,064,944 A * | 5/2000 | Sarda | ...................... | E21B 49/00 702/11 |
| 6,842,725 B1 * | 1/2005 | Sarda | .................... | G01V 11/00 702/11 |

(Continued)

OTHER PUBLICATIONS

Duretz, T., D. A. May, T. V. Gerya, and P. J. Tackley (2011), Discretization errors and free surface stabilization in the finite difference and marker-in-cell method for applied geodynamics: A numerical study, Geochem. Geophys. Geosyst., 12, Q07004, doi:10.1029/2011GC003567. (Year: 2011).*

Fang Wenchao et al, A numerical simulation model for multi-scale flow in tight oil reservoirs, Petrol. Explor. Develop., 2017, 44(3): 446-453. (Year: 2017).*

(Continued)

*Primary Examiner* — Jay Hann
*Assistant Examiner* — Chuen-Meei Gan
(74) *Attorney, Agent, or Firm* — Jaime A. Castano

(57) ABSTRACT

A method for reducing an order of a discrete fractured network simulation. The method includes receiving cells representing a portion of a subterranean formation that includes a fracture. A first plurality of the cells that correspond to the fracture may be marked as a first cell level. A second plurality of the cells that touch the first plurality of cells may be marked as a second cell level. The first plurality of cells may be grouped into a first superelement. The second plurality of cells may be grouped into a second superelement. One of the first plurality of cells in the first superelement may be designated as a master cell. A volume for the master cell may be updated to include volumes for each of the first plurality of cells in the first superelement.

20 Claims, 9 Drawing Sheets

(56) References Cited

U.S. PATENT DOCUMENTS

| | | | |
|---|---|---|---|
| 7,672,825 B2 | 3/2010 | Brouwer et al. | |
| 8,583,411 B2* | 11/2013 | Fung | E21B 49/00 703/10 |
| 8,650,016 B2 | 2/2014 | Lunati et al. | |
| 8,725,481 B2* | 5/2014 | Usadi | E21B 43/12 702/6 |
| 2005/0203725 A1* | 9/2005 | Jenny | E21B 43/00 703/10 |
| 2005/0273298 A1 | 12/2005 | Shah | |
| 2007/0010979 A1* | 1/2007 | Wallis | E21B 49/00 703/10 |
| 2008/0140379 A1 | 6/2008 | Shah et al. | |
| 2008/0208539 A1* | 8/2008 | Lee | E21B 49/00 703/1 |
| 2009/0265150 A1* | 10/2009 | Ye | G06F 17/5036 703/2 |
| 2010/0082724 A1* | 4/2010 | Diyankov | G06F 17/12 708/520 |
| 2010/0094605 A1* | 4/2010 | Hajibeygi | G06F 17/5018 703/2 |
| 2010/0138196 A1* | 6/2010 | Hui | E21B 43/00 703/1 |
| 2011/0002194 A1* | 1/2011 | Imhof | G01V 1/32 367/53 |
| 2011/0098998 A1* | 4/2011 | Lunati | E21B 49/00 703/10 |
| 2011/0191080 A1* | 8/2011 | Klie | G06F 17/50 703/10 |
| 2012/0215513 A1* | 8/2012 | Branets | G01V 99/00 703/10 |
| 2013/0124150 A1* | 5/2013 | Kim | G06F 17/5095 703/1 |

OTHER PUBLICATIONS

Gerya, T. V., D. A. May, and T. Duretz (2013), An adaptive staggered grid finite difference method for modeling geodynamic Stokes flows with strongly variable viscosity, Geochem. Geophys. Geosyst., 14, 1200-1225, doi:10.1002/ggge.20078. (Year: 2013).*

Stefansson, Ivar, Inga Berre, and Eirik Keilegavlen. "Hybrid-Dimensional Finite Volume Discretizations for Fractured Porous Media." arXiv preprint arXiv:1712.08479 (2017). (Year: 2017).*

Jocelyne Erhel, Jean-Raynald De Dreuzy, and Baptiste Poirriez, Flow Simulation in Three-Dimensional Discrete Fracture Networks, vol. 31, No. 4, pp. 2688-2705, 2009 Society for Industrial and Applied Mathematics (Year: 2009).*

Samir Khallouq and Hassan Belhadj, Schur Complement Technique for Advection-Diffusion Equation using Matching Structured Finite Volumes, Advances in Dynamical Systems and Applications ISSN 0973-5321, vol. 8, No. 1, pp. 51-62 (2013) (Year: 2013).*

J-R. de Dreuzy , J. Erhel, G. Pichot, B. Poirriez, Numerical and stochastic models of flow in 3D Discrete Fracture Networks, Special Semester on Multiscale Simulation and Analysis in Energy and the Environment Linz, Oct. 2011 (Year: 2011).*

M., Karimi-Fard et al, An efficient discrete fracture model applicable for general purpose reservoir simulators, SPE 79699, 2003 (Year: 2003).*

Khallouq, Samir, and Hassan Belhadj. "Schur complement technique for advection-diffusion equation using matching structured finite volumes." Advances in Dynamical Systems and Applications 8, No. 1 (2013): 51-62. (Year: 2013).*

Erhel, Jocelyne, Jean-Raynald De Dreuzy, and Baptiste Poirriez. "Flow simulation in three-dimensional discrete fracture networks." SIAM Journal on Scientific Computing 31, No. 4 (2009): 2688-2705. (Year: 2009).*

\* cited by examiner

800

```
      0   1   2 ¦ 3   4   5   6
  0             ¦ X
  1             ¦ X   X
  2             ¦     X   X
  - - - - - - - - - - - - - - -
  3   X   X     ¦             X
  4       X   X ¦
  5           X ¦             X
  6             ¦ X       X
```

MODEL ORDER REDUCTION TECHNIQUE FOR DISCRETE FRACTURED NETWORK SIMULATION

CROSS-REFERENCE TO RELATED APPLICATIONS

This application claims priority to U.S. Provisional Patent Application having Ser. No. 61/916,906, which was filed on Dec. 17, 2013. This provisional application is incorporated by reference herein in its entirety.

BACKGROUND

The recent trend in the oil and gas industry to pursue shale gas and other fracturing-dependent reserves has led to several changes in the character of simulation models. In particular, these models may be unstructured and contain a wide range of length scales. One example of a workflow tool is MANGROVE® for PETREL®, which may use the INTERSECT® simulator. INTERSECT® simulates reservoirs using unstructured grids with a minimized penalty.

However, a performance impact associated with the wide range of length scales remains present in these models. Further, many existing techniques that seek to address simulation of models with a wide range of length scales may compromise the fidelity of the model.

SUMMARY

A method for reducing an order of a discrete fractured network simulation is disclosed. The method includes receiving cells representing a portion of a subterranean formation that includes a fracture. A first plurality of the cells that correspond to the fracture may be marked as a first cell level. A second plurality of the cells that touch the first plurality of cells may be marked as a second cell level. The first plurality of cells may be grouped into a first superelement. The second plurality of cells may be grouped into a second superelement. One of the first plurality of cells in the first superelement may be designated as a master cell. A volume for the master cell may be updated to include volumes for each of the first plurality of cells in the first superelement.

A non-transitory computer readable medium is also disclosed. The medium may store instructions thereon that, when executed by a processor, are configured to cause the processor to perform operations. The operations may include receiving cells representing a portion of a subterranean formation that includes a fracture. A first plurality of the cells that correspond to the fracture may be marked as a first cell level. A second plurality of the cells that touch the first plurality of cells may be marked as a second cell level. The first plurality of cells may be grouped into a first superelement. The second plurality of cells may be grouped into a second superelement. One of the first plurality of cells in the first superelement may be designated as a master cell. A volume for the master cell may be updated to include volumes for each of the first plurality of cells in the first superelement.

A computing system is also disclosed. The computing system may include a processor and a memory system including one or more computer readable media storing instructions thereon that, when executed by the processor, are configured to cause the computing system to perform operations. The operations may include receiving cells representing a portion of a subterranean formation that includes a fracture. A first plurality of the cells that correspond to the fracture may be marked as a first cell level. A second plurality of the cells that touch the first plurality of cells may be marked as a second cell level. The first plurality of cells may be grouped into a first superelement. The second plurality of cells may be grouped into a second superelement. One of the first plurality of cells in the first superelement may be designated as a master cell. A volume for the master cell may be updated to include volumes for each of the first plurality of cells in the first superelement.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures:

FIG. 2 illustrates a flowchart of a method for reducing an order of a discrete fractured network simulation, according to an embodiment.

DETAILED DESCRIPTION

Figure 1:
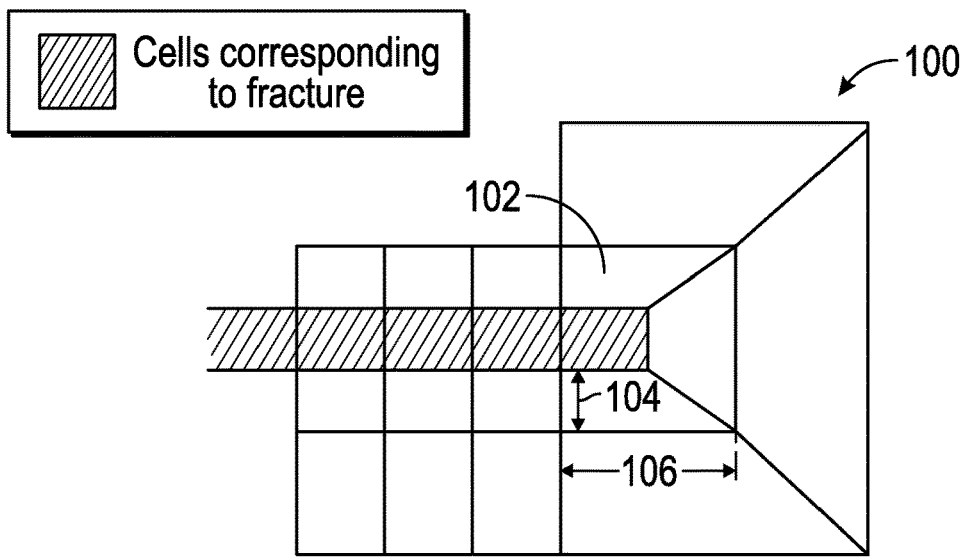
FIGS. 1-1 and 1-2 illustrate a structured grid and an unstructured grid, respectively, representing the same example of a fracture in a subterranean formation, according to an embodiment.

The following detailed description refers to the accompanying drawings. Wherever convenient, the same reference numbers are used in the drawings and the following description to refer to the same or similar parts. While several embodiments and features of the present disclosure are described herein, modifications, adaptations, and other implementations are possible, without departing from the spirit and scope of the present disclosure.

A reservoir model may include a fracture geometry that is explicitly represented as cells in a reservoir simulation grid. In general, these grids may be unstructured and may have been refined, for example, to an extent that exceeds levels of detail used by the surrounding geological features. Embodiments of the present disclosure may select cells to be combined into a "superelement cell" (e.g., to preserve model fidelity) in a number of ways. As used herein, a superelement cell is a group of cells combined for the purpose of being employed as a single cell or element. Embodiments of the disclosure may also combine selected cells using an analytic guiding potential technique that calculates the member elements of the superelement cell and how the superelement cell is connected to other remaining cells. The output of these phases (e.g., selecting and lumping) may be another unstructured model with a reduced but more appropriate level of detail that maintains the fidelity of the input model. In an embodiment, these phases may be applied recursively until the model reaches a certain level of detail.

Figures 1, 2:
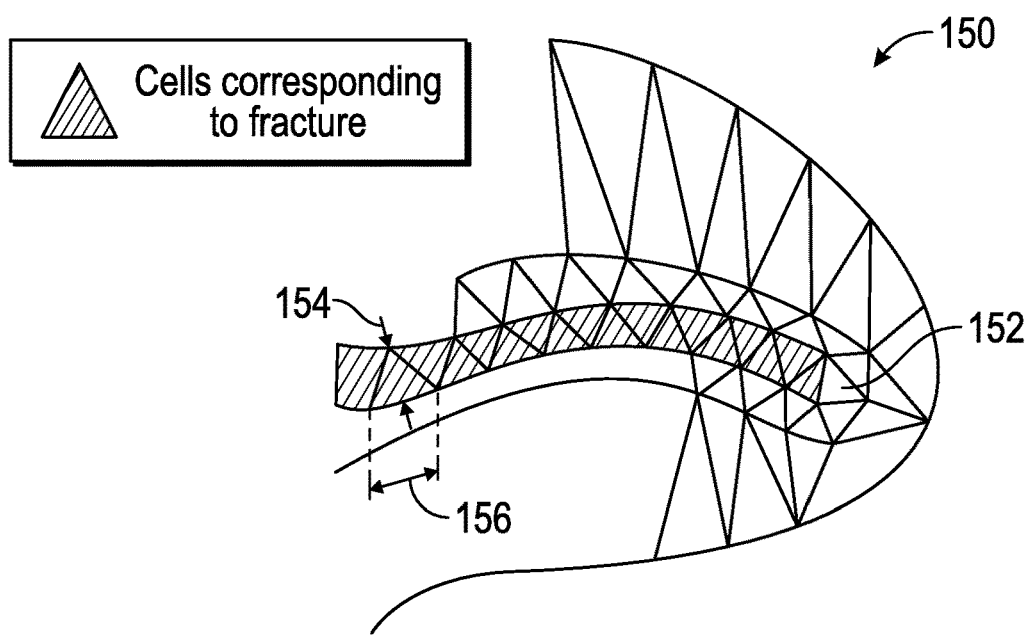
Figure 2:
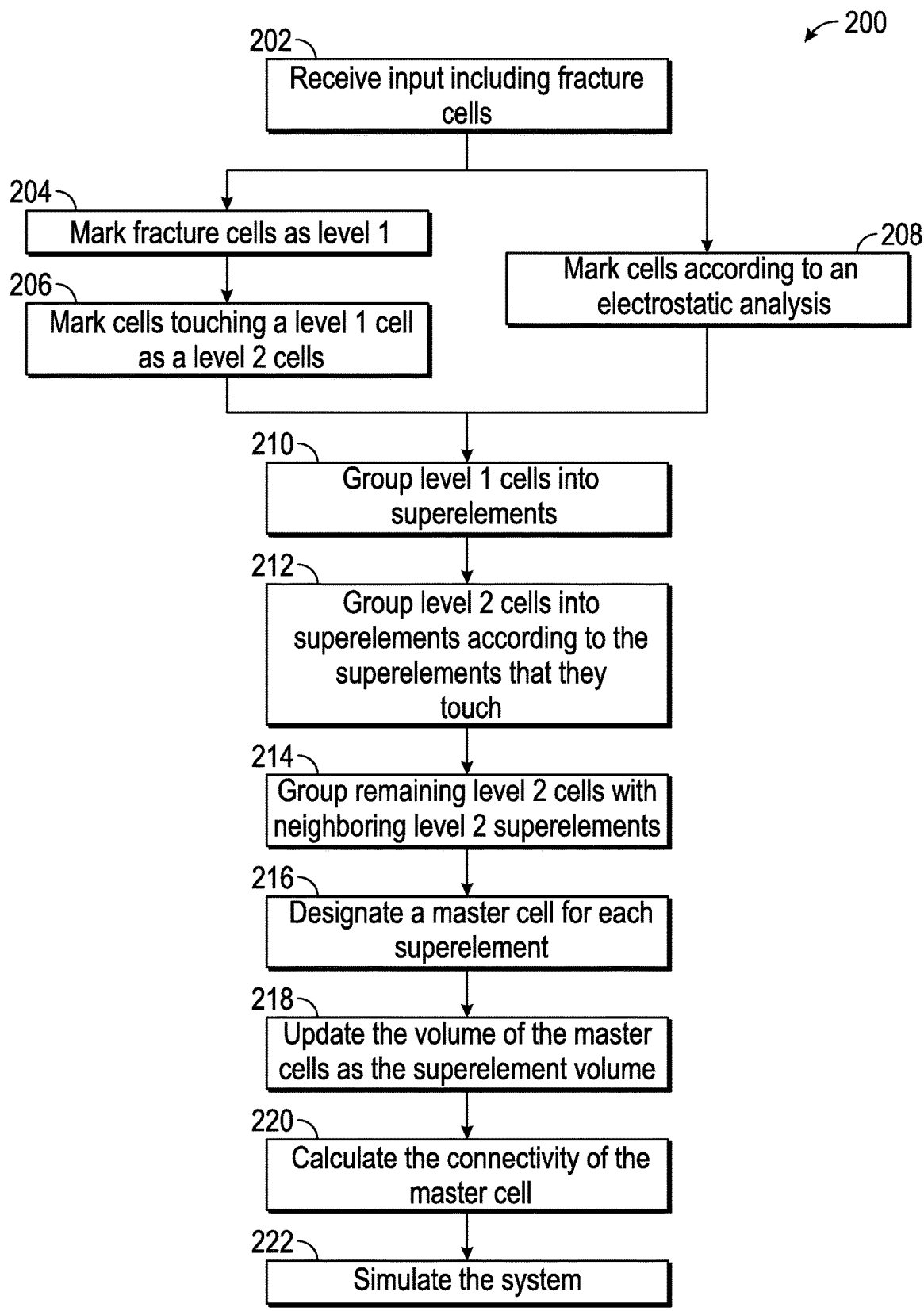

FIGS. 1-1 and 1-2 illustrate a structured grid 100 and an unstructured grid 150, respectively, representing the same example of a fracture in a subterranean formation, according to an embodiment. The structured grid 100 may use thin cells 102. For example, the cells 102 may have a thickness 104 and length 106, with the length 106 exceeding the thickness 104 by one or more orders of magnitude. Specifically, in at least one embodiment, the thickness 104 may be measured in centimeters, and the length 106 may be of the same order of magnitude as the extent of the fracture (e.g., meters).

The unstructured grid 150 may include cells 152. The cells 152 may represent the fracture (e.g., the same fracture shown in FIG. 1-1) in the model. As shown, the thicknesses 154 of the cells 152 may be equal or substantially equal, and the lengths 156 of the cells 152 may be equal or substantially equal. As used herein, "substantially equal" allows for a variation of +/−10%). These cells 152 may be of the same order of magnitude as the thickness 154 in the neighborhood of the fracture.

The unstructured grid 150 may have more cells 152 than the structured grid 100 to represent the same reservoir volume. The increase may be, for example, by a factor of about O(1/delta), where O is the "order of magnitude," 1 represents the length 156 of the cells 152, and delta represents the thickness 154 of the cells 152. In some cases, this may result in simulations of the unstructured grid 150 having a reduced average time step, which may be related to the minimum volume of the cells 152. The reduced average time step, in turn, may lead to increased simulation time and/or cost.

The level of detail in the unstructured grid 150 may, however, be reduced along portions of the length of the fracture while still capturing the physical behavior of the fracture. For example, the macroscopic flow may be orthogonal to the surface of the fracture; thus, a simplification 1>>delta in the structured grid 100 may be acceptable.

Phase 1: Selection

Figure 3:
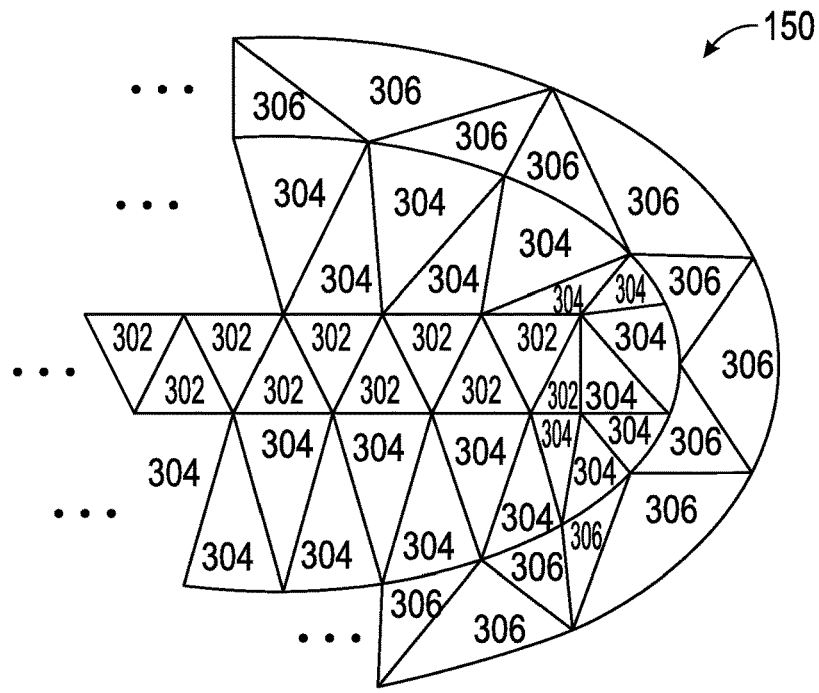
FIG. 3 illustrates a portion of the unstructured grid of FIG. 1-2 showing the cells being assigned to different levels (e.g., one, two, etc.), according to an embodiment.

Referring now to FIG. 2, there is shown a flowchart of a method 200 for reducing an order of a discrete fractured network simulation, according to an embodiment. The method 200 shown in FIG. 2 may be better understood in conjunction with FIGS. 3-14. FIG. 3 illustrates a portion of the unstructured grid 150 of FIG. 1-2, according to an embodiment. With reference to FIGS. 2 and 3, the method 200 may begin by receiving an input of cells 302, 304, 306 representing a portion of a subterranean formation that includes a fracture, as at 202 in FIG. 2. The cells 302 may correspond to the fracture, for example, a portion of the cells 152 shown in FIG. 1-2. The input may be part of a discretized domain and may be known a priori. The cells 302 corresponding to the fracture may be identified by any suitable technique.

The method 200 may also include marking the cells 302 corresponding to the fracture as a first level (e.g., level one), as at 204 in FIG. 2. The cells 304 that touch a level one cell 302 with either a face or a vertex may be marked as a second level (e.g., level two), as at 206 in FIG. 2. These cells 304 may surround the fracture. The cells 306 that touch a level two cell 304 may be marked as a third level (e.g., level three). The process of marking at 204 and 206 may be repeated with each new level (level four, five, etc.) selecting those cells that touch any cell in the preceding level.

The process of marking may be terminated for many reasons. For example, if the fracture is isolated, then the "superelements" (introduced below) may reach a size that is substantially equal to that used by the background geology. In another example, the superelements may be impeded from growing further by superelements from another nearby fracture. In yet another example, the superelement may approach another area of the grid for which the length scale has been prescribed prior to this process (e.g., in the neighborhood of a well).

In another embodiment, the assignment of cells 302, 304, 306 to levels may be determined by solving an electrostatic problem, as at 208. In such an embodiment, the fractures may be assigned non-zero potentials and the boundary a zero potential. The levels of each cell 302, 304, 306 may correspond to its potential value (e.g., scaled logarithmically). The cost of such electrostatic marking may be of the same order of magnitude as the process above.

Figure 4:
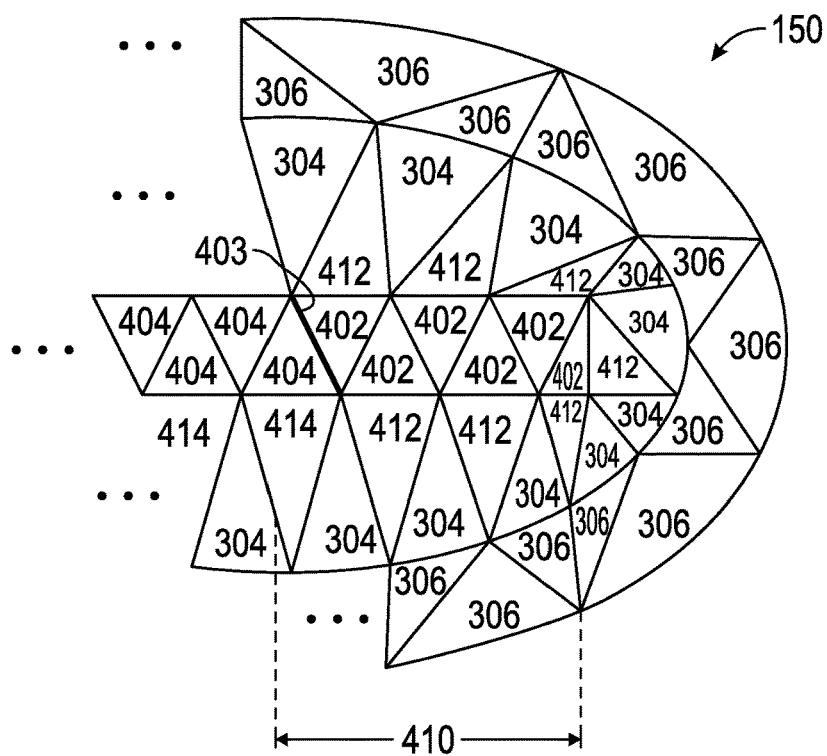
FIG. 4 illustrates the portion of the unstructured grid of FIG. 3 showing the level zero cells and a portion of the level one cells being assigned to superelements, according to an embodiment.

FIG. 4 illustrates the portion of the unstructured grid 150 showing the cells 302 corresponding to the fracture (e.g., level one cells) from FIG. 3 being assigned to superelements 402, 404, according to an embodiment. Referring now to FIGS. 2-4, the method 200 may proceed to grouping the level one cells 302 into level one superelements 402, 404, as at 210 in FIG. 2. The superelements 402, 404 may have a characteristic length 410 that may be of order 1: O(1). The user may determine the length 410 by selecting a dividing line 403 to separate the two superelements 402, 404.

The level two cells 304 from FIG. 3 may be grouped according to the level one superelements 402, 404 they are connected to via a face, as at 212 in FIG. 2. Thus, as shown in FIG. 4, the cells 304 that share a face with the superelement 402 have been assigned to superelement 412, and the cells 304 that share a face with the superelement 404 have been assigned to superelement 414. The cells 304 that share a vertex, but not a face with the superelements 402, 404 may remain cells 304.

Figure 5:
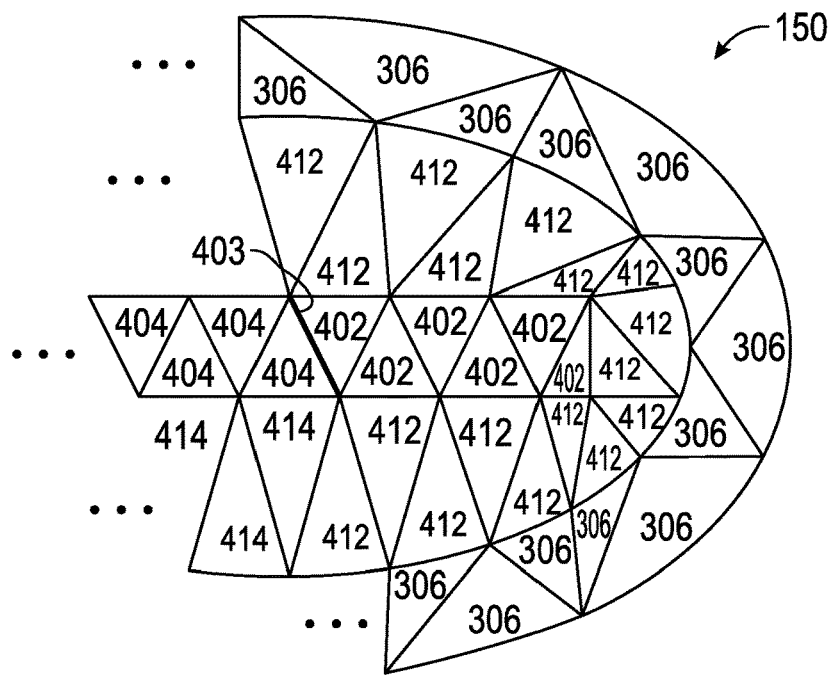
FIG. 5 illustrates the portion of the unstructured grid of FIG. 4 showing the remaining level one cells being assigned to a neighboring superelement, according to an embodiment.

FIG. 5 illustrates the portion of the unstructured grid 150 showing the remaining cells 304 from FIG. 4 being assigned to a neighboring superelement 412, 414, according to an embodiment. The remaining level two cells 304 (e.g., cells 304 that share a vertex with the superelements 402, 404) may be assigned to the neighboring level two superelement 412, 414, as at 214. In other words, the remaining level two cells 304 may be assigned to the level two superelement 412, 414 with which they share a face. This process may be applied recursively until each of the remaining cells 304 has been assigned to a superelement 412, 414.

Figure 6:
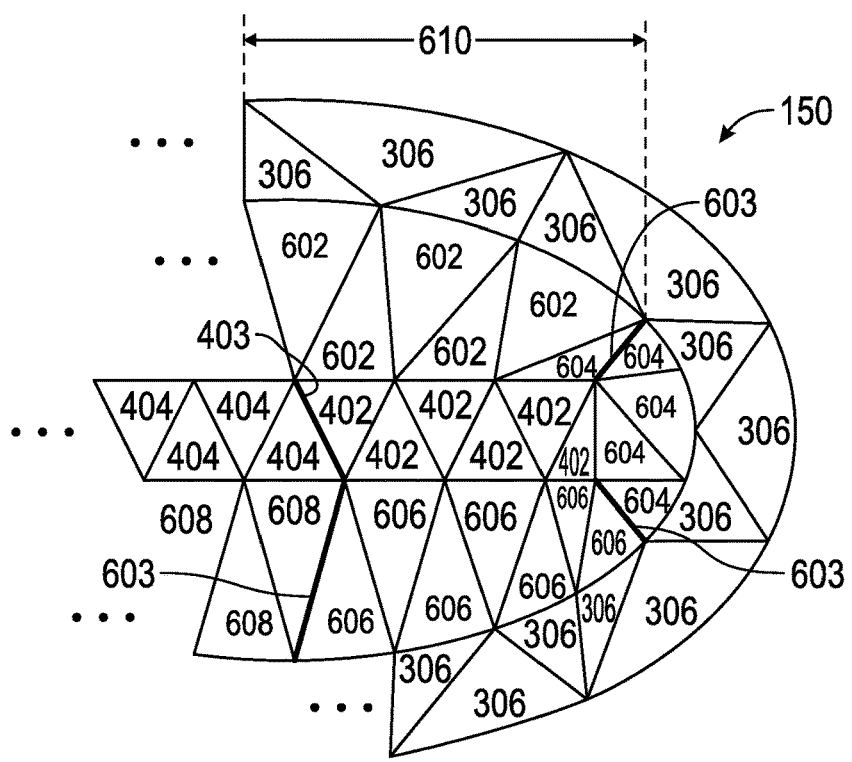
FIG. 6 illustrates the portion of the unstructured grid of FIG. 5 showing the level one cells being re-assigned to four superelements, according to an embodiment.

FIG. 6 illustrates the portion of the unstructured grid 150 showing the superelements 412, 414 being re-assigned to superelements 602, 604, 606, 608, according to an embodiment. The superelements 412, 414 shown in FIG. 5 may have a greater characteristic length than the superelements 402, 404 (see length 410 in FIG. 4). As such, the superelements 412, 414 may be grouped into superelements 602, 604, 606, 608, each of which has substantially the same characteristic length 610 as the superelements 402, 404. The user may determine the length 610 by selecting appropriate dividing lines 603 to separate the superelements 602, 604, 606, 608.

Phase 2: Lumping

Figures 7, 8:
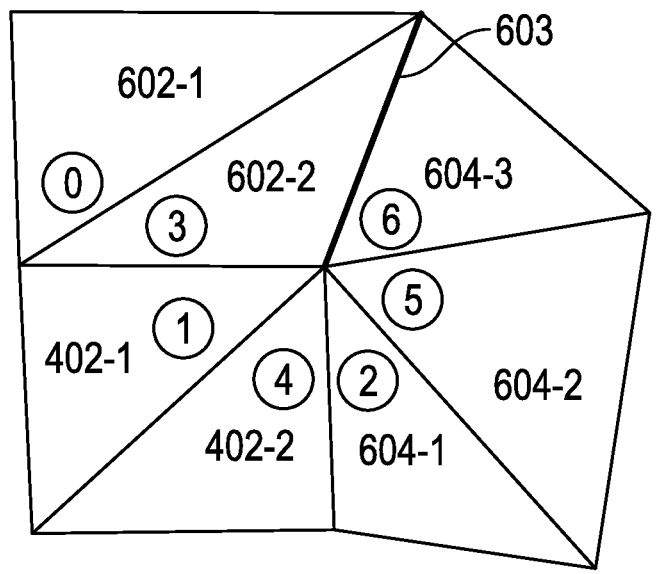
FIG. 7 illustrates a portion of the superelements from FIG. 6 showing one cell in each superelement being designated as a primary or "master" cell, and the remaining cells being designated as secondary or "slave" cells, according to an embodiment.
FIG. 8 illustrates a matrix corresponding to the cells shown in FIG. 7, according to an embodiment.

FIG. 7 depicts a portion of the superelements 402, 602, 604 from FIG. 6 showing one cell 402-1, 602-1, 604-1 in each superelement 402, 602, 604 being designated as a primary or "master" cell, and the remaining cells 402-2, 602-2, 604-2, 604-3 being designated as secondary or "slave" cells, according to an embodiment. The method 200 may proceed to designating one cell 402-1, 602-1, 604-1 contained in each superelement 402, 602, 604 as a "master" cell, as at 216. Each of the cells 402-1, 402-2, 602-1, 602-2, 604-1, 604-2, 604-3 may also be assigned an identifier. The identifiers in FIG. 7 are the Arabic numbers 0-6; however, in other embodiments, other identifiers (letters, Roman numerals, etc.) may be used.

FIG. 8 depicts a matrix 800 corresponding to the cells 402-1, 402-2, 602-1, 602-2, 604-1, 604-2, 604-3 shown in FIG. 7, according to an embodiment. The connectivity of the cells 402-1, 402-2, 602-1, 602-2, 604-1, 604-2, 604-3 may be represented in the matrix 800, analogous to the nodal representation of an electrical circuit. More particularly, the matrix 800 may indicate which cells 402-1, 402-2, 602-1, 602-2, 604-1, 604-2, 604-3 are connected to one another via a face. The rows and columns of the matrix 800 may each correspond to the identifiers 0-6 shown in FIG. 7. For example, the cell 602-2, identified by Arabic number 3, has faces connected to the cells 602-1, 402-1, and 604-3, identified by Arabic numbers 0, 1, and 6, respectively. Accordingly, an indicator (an "X") has been placed in row 3, columns 0, 1, and 6 and column 3, rows 0, 1, and 6. Once cast in this form, the slave cells may be removed from the dynamical system. This may be accomplished using a Schur complement. More particularly, the Schur complement may be used to resolve the connectivity of the cells 402-1, 402-2, 602-1, 602-2, 604-1, 604-2, 604-3, and to remove the connections between the slave cells, while leaving the connections between the master cells. This is a generalization of the traditional "star-delta" transform of electrical engineering.

Figure 9:
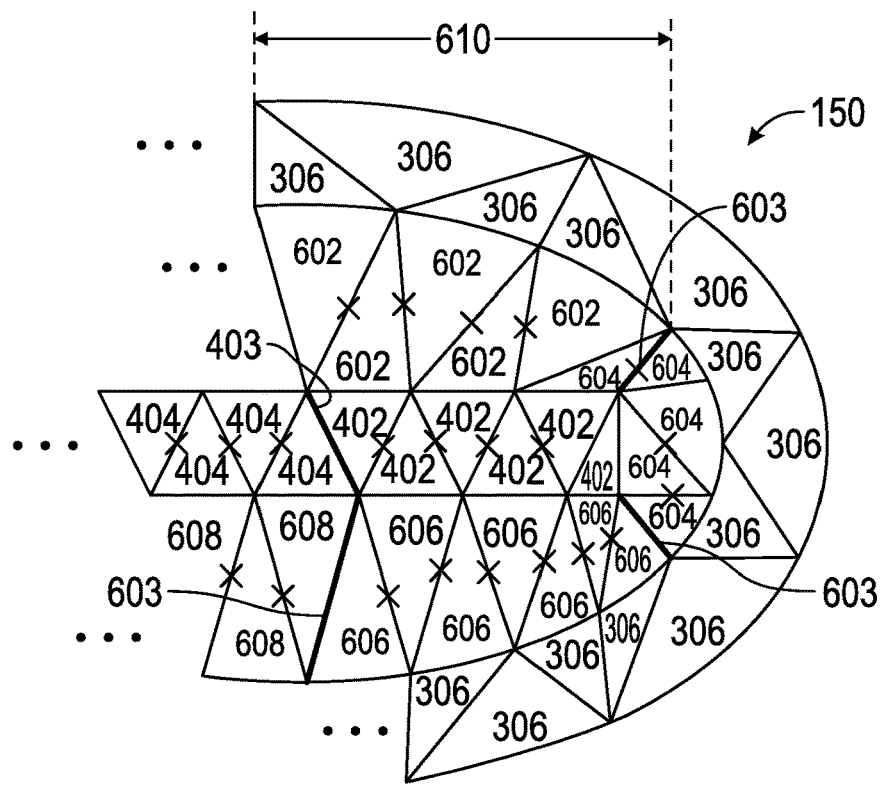
FIG. 9 illustrates the portion of the unstructured grid including the cells shown in FIG. 7, according to an embodiment.

FIG. 9 depicts the portion of the unstructured grid 150 including the cells 402-1, 402-2, 602-1, 602-2, 604-1, 604-2, 604-3 shown in FIG. 7, according to an embodiment. The volume of each master cell (e.g. cell 402-1) may be updated to include the sum of the volumes of the cells (master and slave cells) contained in that superelement (e.g., superelement 402), as at 218 in FIG. 2. This is illustrated by crossing out the lines joining adjacent cells in each superelement 402, 404, 602, 604, 606, 608, as shown in FIG. 9. The master cells may be displayed (e.g., on a monitor) before and/or after the volumes of the cells contained in the superelement have been included.

Figure 10:
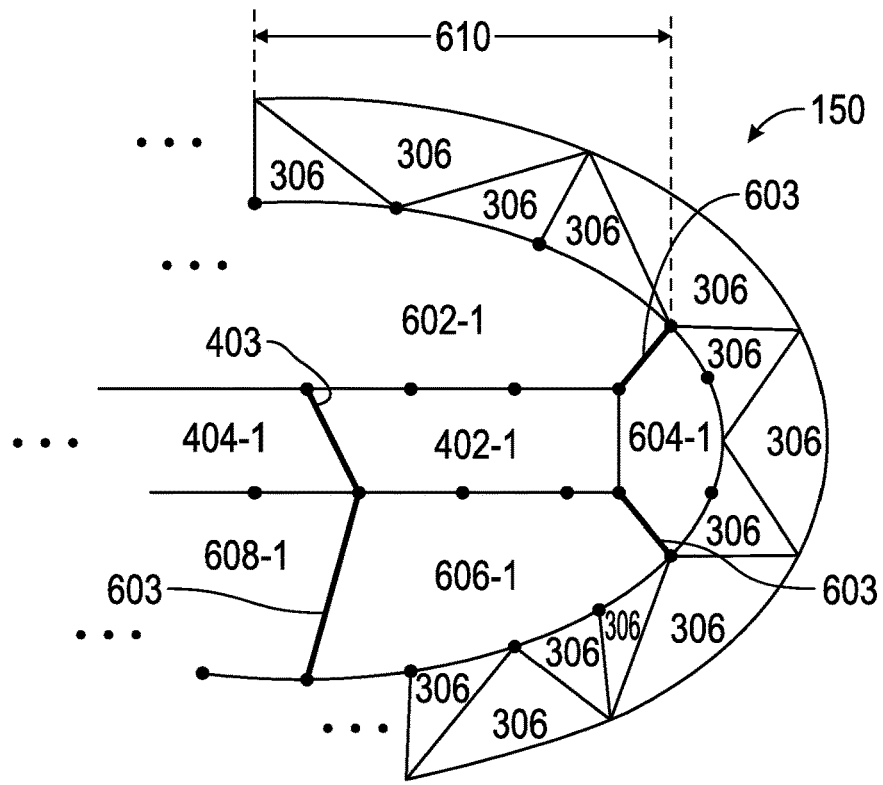
FIG. 10 illustrates the master cells including the volumes of the cells (master and slave cells) contained in that superelement, according to an embodiment.

FIG. 10 depicts the master cells (e.g. cell 402-1) including the volumes of the cells (master and slave cells) contained in that superelement (e.g. superelement 402), according to an embodiment. As shown, the lines separating the cells (e.g., cells 402-1, 402-2) in each superelement (e.g., superelement 402) may be removed to illustrate master cells (e.g. cell 402-1) including the volumes of the each of the cells (e.g., cells 402-1, 402-2, etc.) contained in that superelement (e.g., superelement 402).

Figure 11:
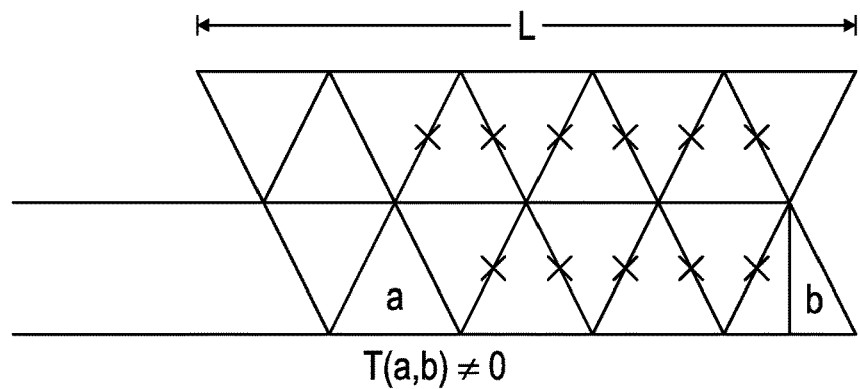
FIG. 11 illustrates the identification of flows to be removed, according to an embodiment.
Figure 12:
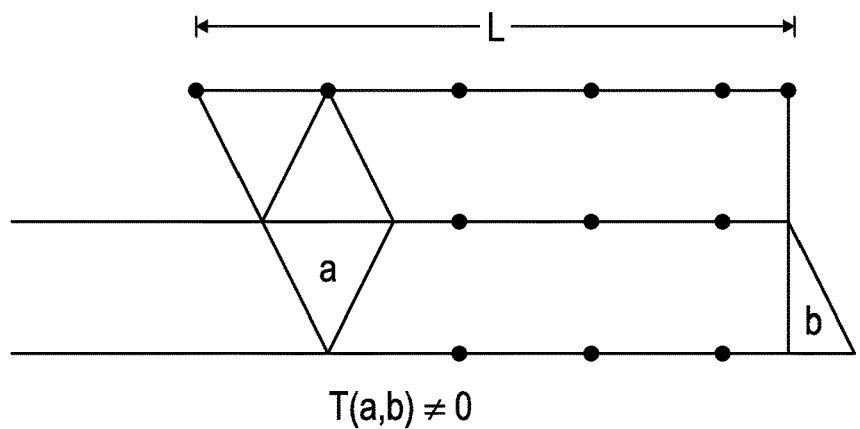
FIG. 12 illustrates the resulting volumes after the removal shown in FIG. 11, according to an embodiment.
Figure 13:
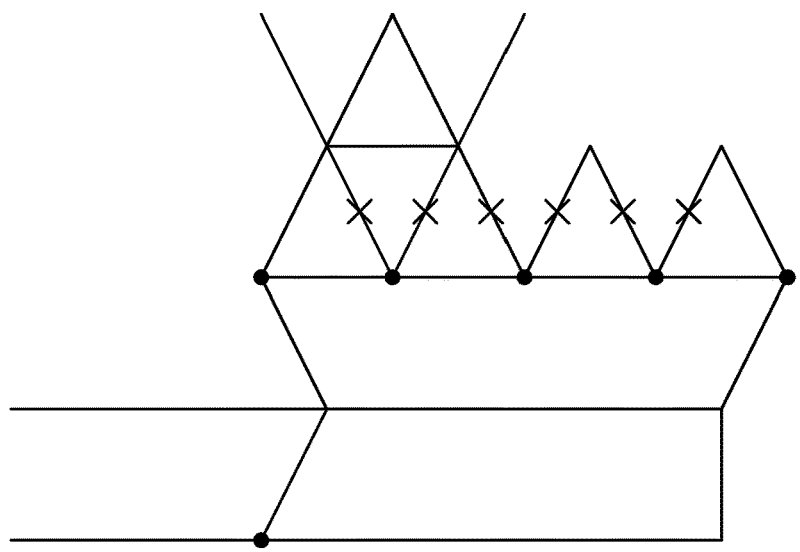
FIG. 13 illustrates how the procedure of FIGS. 11 and 12 may be applied recursively, according to an embodiment.

FIGS. 11-13 illustrate representations of the effects of the Schur complement method. FIG. 11 illustrates the faces connecting slave cells to each other being removed, according to an embodiment. More particularly, FIG. 11 shows the internal edges of a superelement being removed.

FIG. 12 illustrates the superelement after the slave cells have been collapsed into the master cell and how the flow path between master cells is preserved, according to an embodiment. More particularly, FIG. 12 shows the flow between master cells a and b having been maintained after the Schur method has been applied.

FIG. 13 illustrates the collapse of multiple faces joining the same, master cells and how the process may be applied recursively, according to an embodiment. The Schur method may also take care of the fact that each superelement begins with multiple faces to other superelements. These may be combined as part of the Schur method.

Figure 14:
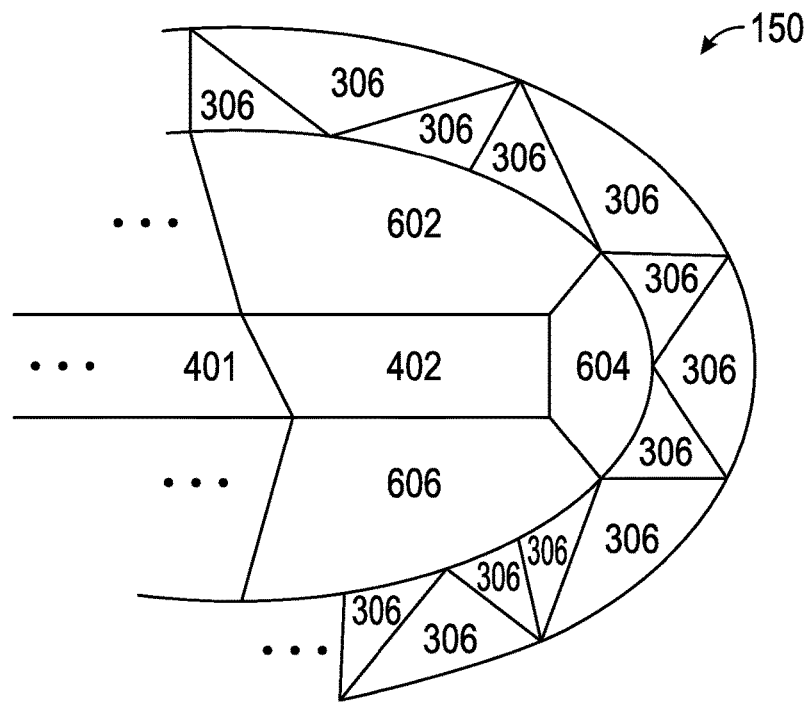
FIG. 14 illustrates the unstructured grid with a reduced level of detail, according to an embodiment.

FIG. 14 illustrates the unstructured grid 150 with a reduced level of detail, according to an embodiment. Once the Schur method has been completed, the unstructured grid 150 may appear as shown in FIG. 14. If further reduction in the order of the unstructured grid 150 is desired, the superelements 402, 404, 602, 604, 606, 608 may be "reclassified" as cells, as at 220 in FIG. 2. The process may then repeat again. For example, the reclassified cells may be marked (e.g., at blocks 204, 206) and grouped (e.g., at blocks 210, 212), etc.

Figure 15:
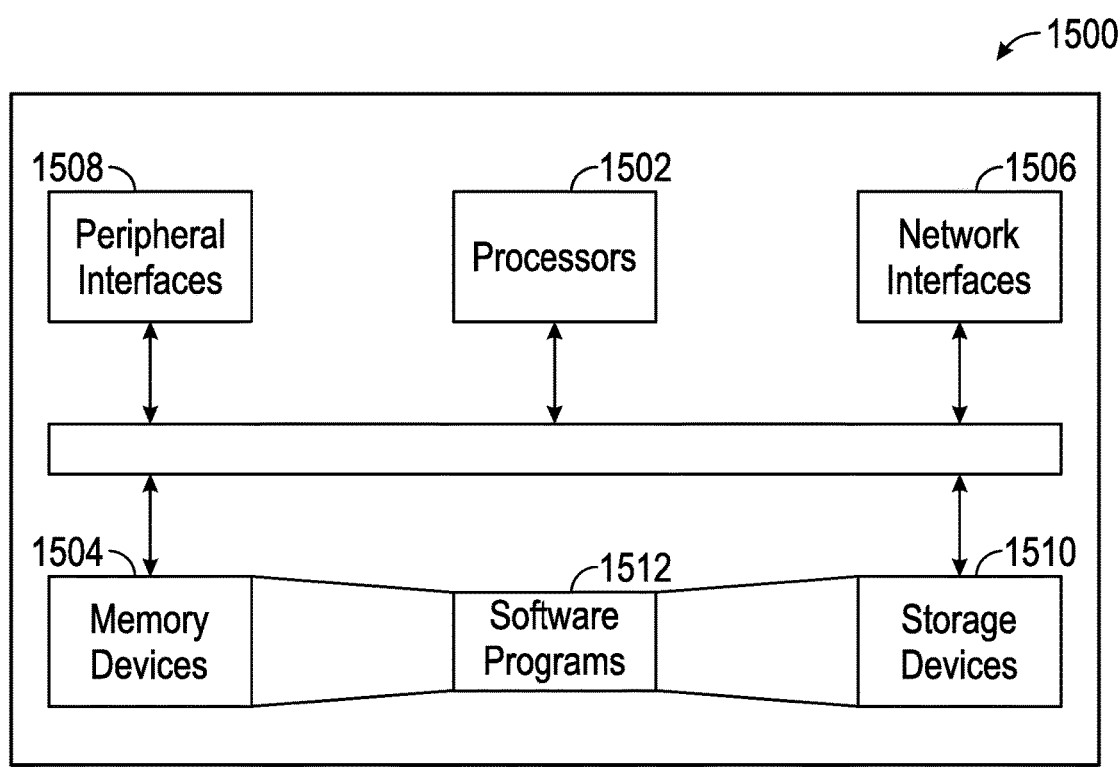
FIG. 15 illustrates a schematic view of a computing system for executing one or more of the methods disclosed herein, according to an embodiment.

Embodiments of the disclosure may also include one or more systems for implementing one or more embodiments of the method 200. FIG. 15 illustrates a schematic view of such a computing or processor system 1500, according to an embodiment. The processor system 1500 may include one or more processors 1502 of varying core configurations (including multiple cores) and clock frequencies. The one or more processors 1502 may be operable to execute instructions, apply logic, etc. It will be appreciated that these functions may be provided by multiple processors or multiple cores on a single chip operating in parallel and/or communicably linked together.

The processor system 1500 may also include a memory system, which may be or include one or more memory devices and/or computer-readable media 1504 of varying physical dimensions, accessibility, storage capacities, etc. such as flash drives, hard drives, disks, random access memory, etc., for storing data, such as images, files, and program instructions for execution by the processor 1502. In an embodiment, the computer-readable media 1504 may store instructions that, when executed by the processor 1502, are configured to cause the processor system 1500 to perform operations. For example, execution of such instructions may cause the processor system 1500 to implement one or more portions and/or embodiments of the method 1500 described above.

The processor system 1500 may also include one or more network interfaces 1506. The network interfaces 1506 may include any hardware, applications, and/or other software. Accordingly, the network interfaces 1506 may include Ethernet adapters, wireless transceivers, Peripheral Component Interconnect (PCI) interfaces, and/or serial network components, for communicating over wired or wireless media using protocols, such as Ethernet, wireless Ethernet, etc.

The processor system 1500 may further include one or more peripheral interfaces 1508, for communication with a display screen, projector, keyboards, mice, touchpads, sensors, other types of input and/or output peripherals, and/or the like. In some implementations, the components of processor system 1500 may not be enclosed within a single enclosure or even located in close proximity to one another, but in other implementations, the components and/or others may be provided in a single enclosure.

The memory device 1504 may be physically or logically arranged or configured to store data on one or more storage devices 1510. The storage device 1510 may include one or more file systems or databases in any suitable format. The storage device 1510 may also include one or more software programs 1512, which may contain interpretable or executable instructions for performing one or more of the disclosed processes. When requested by the processor 1502, one or more of the software programs 1512, or a portion thereof, may be loaded from the storage devices 1510 to the memory devices 1504 for execution by the processor 1502.

Those skilled in the art will appreciate that the above-described componentry is merely one example of a hardware configuration, as the processor system 1500 may include any type of hardware components, including any accompanying firmware or software, for performing the disclosed implementations. The processor system 1500 may also be implemented in part or in whole by electronic circuit components or processors, such as application-specific integrated circuits (ASICs) or field-programmable gate arrays (FPGAs).

The foregoing description of the present disclosure, along with its associated embodiments and examples, has been presented for purposes of illustration only. It is not exhaustive and does not limit the present disclosure to the precise form disclosed. Those skilled in the art will appreciate from the foregoing description that modifications and variations are possible in light of the above teachings or may be acquired from practicing the disclosed embodiments.

For example, the same techniques described herein with reference to the processor system 1500 may be used to execute programs according to instructions received from another program or from another processor system altogether. Similarly, commands may be received, executed, and their output returned entirely within the processing and/or memory of the processor system 1500. Accordingly, neither a visual interface command terminal nor any terminal at all is strictly necessary for performing the described embodiments.

Figure 16:
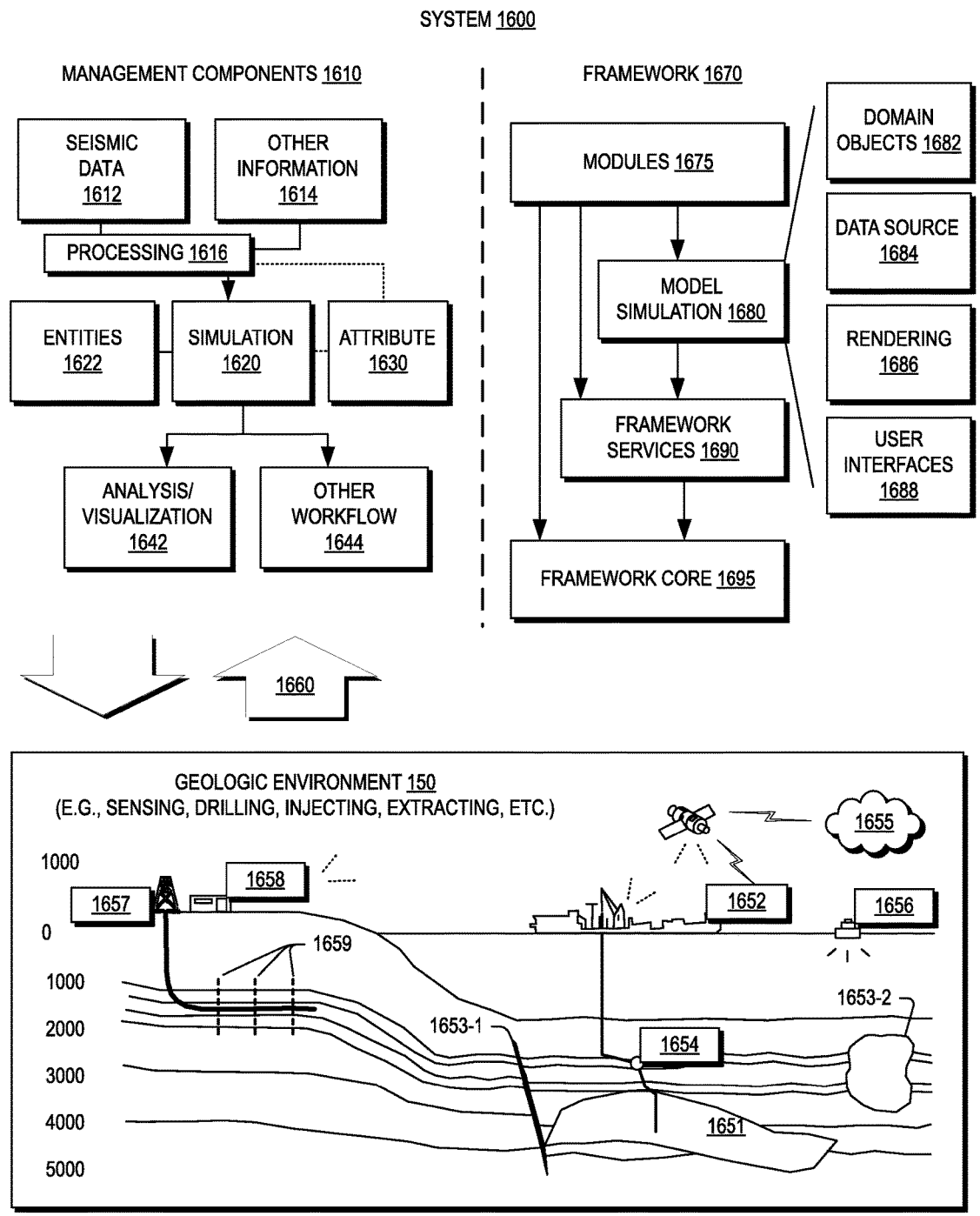
FIG. 16 illustrates an example of a system that includes various management components to manage various aspects of a geologic environment, according to an embodiment.

In some embodiments, the system 1500, which may execute one or more embodiments of the method 200, may be implemented within a geological modeling framework. FIG. 16 illustrates an example of a system 1600 that includes various management components 1610 to manage various aspects of a geologic environment 1650 (e.g., an environment that includes a sedimentary basin, a reservoir 1651, one or more faults 1653-1, one or more geobodies 1653-2, etc.). For example, the management components 1610 may allow for direct or indirect management of sensing, drilling, injecting, extracting, etc., with respect to the geologic environment 1650. In turn, further information about the geologic environment 1650 may become available as feedback 1660 (e.g., optionally as input to one or more of the management components 1610).

In the example of FIG. 16, the management components 1610 include a seismic data component 1612, an additional information component 1614 (e.g., well/logging data), a processing component 1616, a simulation component 1620, an attribute component 1630, an analysis/visualization component 1642 and a workflow component 1644. In operation, seismic data and other information provided per the components 1612 and 1614 may be input to the simulation component 1620.

In an example embodiment, the simulation component 1620 may rely on entities 1622. Entities 1622 may include earth entities or geological objects such as wells, surfaces, bodies, reservoirs, etc. In the system 1600, the entities 1622 can include virtual representations of actual physical entities that are reconstructed for purposes of simulation. The entities 1622 may include entities based on data acquired via sensing, observation, etc. (e.g., the seismic data 1612 and other information 1614). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 1620 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Wash.), which provides a set of extensible object classes. In the .NET® framework, an object class encapsulates a module of reusable code and associated data structures. Object classes can be used to instantiate object instances for use in by a program, script, etc. For example, borehole classes may define objects for representing boreholes based on well data.

In the example of FIG. 16, the simulation component 1620 may process information to conform to one or more attributes specified by the attribute component 1630, which may include a library of attributes. Such processing may occur prior to input to the simulation component 1620 (e.g., consider the processing component 1616). As an example, the simulation component 1620 may perform operations on input information based on one or more attributes specified by the attribute component 1630. In an example embodiment, the simulation component 1620 may construct one or more models of the geologic environment 1650, which may be relied on to simulate behavior of the geologic environment 1650 (e.g., responsive to one or more acts, whether natural or artificial). In the example of FIG. 16, the analysis/visualization component 1642 may allow for interaction with a model or model-based results (e.g., simulation results, etc.). As an example, output from the simulation component 1620 may be input to one or more other workflows, as indicated by a workflow component 1644.

As an example, the simulation component 1620 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 1610 may include features of a commercially available framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 1610 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 16 also shows an example of a framework 1670 that includes a model simulation layer 1680 along with a framework services layer 1690, a framework core layer 1695 and a modules layer 1675. The framework 1670 may include the commercially available OCEAN® framework where the model simulation layer 1680 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 16, the model simulation layer 1680 may provide domain objects 1682, act as a data source 1684, provide for rendering 1686 and provide for various user interfaces 1688. Rendering 1686 may provide a graphical environment in which applications can display their data while the user interfaces 1688 may provide a common look and feel for application user interface components.

As an example, the domain objects 1682 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 16, data may be stored in one or more data sources (or data stores, generally physical data storage devices), which may be at the same or different physical sites and accessible via one or more networks. The model simulation layer 1680 may be configured to model projects. As such, a particular project may be stored where stored project information may include inputs, models, results and cases. Thus, upon completion of a modeling session, a user may store a project. At a later time, the project can be accessed and restored using the model simulation layer 1680, which can recreate instances of the relevant domain objects.

In the example of FIG. 16, the geologic environment 1650 may include layers (e.g., stratification) that include a reservoir 1651 and one or more other features such as the fault 1653-1, the geobody 1653-2, etc. As an example, the geologic environment 1650 may be outfitted with any of a variety of sensors, detectors, actuators, etc. For example, equipment 1652 may include communication circuitry to receive and to transmit information with respect to one or more networks 1655. Such information may include information associated with downhole equipment 1654, which may be equipment to acquire information, to assist with resource recovery, etc. Other equipment 1656 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 16 shows a satellite in communication with the network 1655 that may be configured for communications, noting that the satellite may additionally or alternatively include circuitry for imagery (e.g., spatial, spectral, temporal, radiometric, etc.).

FIG. 16 also shows the geologic environment 1650 as optionally including equipment 1657 and 1658 associated with a well that includes a substantially horizontal portion that may intersect with one or more fractures 1659. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 1657 and/or 1658 may include components, a system, systems, etc. for fracturing, seismic sensing, analysis of seismic data, assessment of one or more fractures, etc.

As mentioned, the system 1600 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Likewise, the steps described need not be performed in the same sequence discussed or with the same degree of separation. Various steps may be omitted, repeated, combined, or divided, as necessary to achieve the same or similar objectives or enhancements. Accordingly, the present disclosure is not limited to the above-described embodiments, but instead is defined by the appended claims in light of their full scope of equivalents. Further, in the above description and in the below claims, unless specified otherwise, the term "execute" and its variants are to be interpreted as pertaining to any operation of program code or instructions on a device, whether compiled, interpreted, or run using other techniques.

What is claimed is:

1. A method for reducing an order of a discrete fractured network simulation, comprising:
    receiving cells representing a portion of a subterranean formation that includes a fracture;
    marking a first plurality of the cells that correspond to the fracture as a first cell level;
    marking a second plurality of the cells that touch the first plurality of cells as a second cell level;
    grouping the first plurality of cells into a first superelement;
    grouping the second plurality of cells into a second superelement;
    designating one of the first plurality of cells in the first superelement as a master cell;
    updating a volume for the master cell to include volumes for each of the first plurality of cells in the first superelement;
    resolving a connectivity for one or more of the first plurality of cells in the first superelement;
    removing connections between slave cells in the first superelement;
    displaying the master cell after the volumes for each of the first plurality of cells in the first superelement have been included; and
    performing, using a processor, the discrete fracture network simulation based on the volume for the master cell, wherein the discrete fracture network simulation corresponds to the subterranean formation that includes the fracture.

2. The method of claim 1, wherein grouping the second plurality of cells into the second superelement comprises grouping a first portion of the second plurality of cells into the second superelement, wherein the first portion of the second plurality of cells each share a face with the first superelement.

3. The method of claim 2, wherein grouping the second plurality of cells into the second superelement further comprises grouping a second portion of the second plurality of cells into the second superelement, wherein the second portion of the second plurality of cells each share a face with at least one of the cells in the first portion.

4. The method of claim 1, further comprising dividing the second superelement into first and second portions, and wherein at least one of the first and second portions has substantially the same characteristic length as the first superelement.

5. The method of claim 1, wherein resolving the connectivity comprises using a Schur complement.

6. The method of claim 1, further comprising:
    reclassifying a first plurality of superelements, including the first superelement, as first reclassified cells;
    marking the first reclassified cells as a first reclassified cell level; and
    grouping the first reclassified cells into a first reclassified superelement.

7. The method of claim 6, further comprising:
    reclassifying a second plurality of superelements, including the second superelement, as second reclassified cells;
    marking the second reclassified cells as a second reclassified cell level; and
    grouping the second reclassified cells into a second reclassified superelement.

8. A non-transitory computer readable medium storing instructions thereon that, when executed by a processor, are configured to cause the processor to perform operations, the operations comprising:
    receiving cells representing a portion of a subterranean formation that includes a fracture;
    marking a first plurality of the cells that correspond to the fracture as a first cell level;
    marking a second plurality of the cells that touch the first plurality of cells as a second cell level;
    grouping the first plurality of cells into a first superelement;
    grouping the second plurality of cells into a second superelement;
    designating one of the first plurality of cells in the first superelement as a master cell;
    updating a volume for the master cell to include volumes for each of the first plurality of cells in the first superelement;
    resolving a connectivity for one or more of the first plurality of cells in the first superelement;
    removing connections between slave cells in the first superelement;
    displaying the master cell after the volumes for each of the first plurality of cells in the first superelement have been included; and
    performing a discrete fracture network simulation based on the volume for the master cell, wherein the discrete fracture network simulation corresponds to the subterranean formation that includes the fracture.

9. The computer readable medium of claim 8, wherein grouping the second plurality of cells into the second superelement comprises grouping a first portion of the second plurality of cells into the second superelement, wherein the first portion of the second plurality of cells each share a face with the first superelement.

10. The computer readable medium of claim 9, wherein grouping the second plurality of cells into the second superelement further comprises grouping a second portion of the second plurality of cells into the second superelement, wherein the second portion of the second plurality of cells each share a face with at least one of the cells in the first portion.

11. The computer readable medium of claim 8, the operations further comprising dividing the second superelement into first and second portions, and wherein at least one of the first and second portions has substantially the same characteristic length as the first superelement.

12. The computer readable medium of claim 8, wherein resolving the connectivity comprises using a Schur complement.

13. The computer readable medium of claim 8, the operations further comprising:
reclassifying a first plurality of superelements, including the first superelement, as first reclassified cells;
marking the first reclassified cells as a first reclassified cell level; and
grouping the first reclassified cells into a first reclassified superelement.

14. The computer readable medium of claim 13, the operations further comprising:
reclassifying a second plurality of superelements, including the second superelement, as second reclassified cells;
marking the second reclassified cells as a second reclassified cell level; and
grouping the second reclassified cells into a second reclassified superelement.

15. A computing system, comprising:
a processor; and
a memory system comprising one or more computer readable media storing instructions thereon that, when executed by the processor, are configured to cause the computing system to perform operations, the operations comprising:
receiving cells representing a portion of a subterranean formation that includes a fracture;
marking a first plurality of the cells that correspond to the fracture as a first cell level;
marking a second plurality of the cells that touch the first plurality of cells as a second cell level;
grouping the first plurality of cells into a first superelement;
grouping the second plurality of cells into a second superelement;
designating one of the first plurality of cells in the first superelement as a master cell;
updating a volume for the master cell to include volumes for each of the first plurality of cells in the first superelement;
resolving a connectivity for one or more of the first plurality of cells in the first superelement;
removing connections between slave cells in the first superelement;
displaying the master cell after the volumes for each of the first plurality of cells in the first superelement have been included; and
performing a discrete fracture network simulation based on the volume for the master cell, wherein the discrete fracture network simulation corresponds to the subterranean formation that includes the fracture.

16. The system of claim 15, wherein grouping the second plurality of cells into the second superelement comprises grouping a first portion of the second plurality of cells into the second superelement, wherein the first portion of the second plurality of cells each share a face with the first superelement.

17. The system of claim 16, wherein grouping the second plurality of cells into the second superelement further comprises grouping a second portion of the second plurality of cells into the second superelement, wherein the second portion of the second plurality of cells each share a face with at least one of the cells in the first portion.

18. The system of claim 15, the operations further comprising dividing the second superelement into first and second portions, and wherein at least one of the first and second portions has substantially the same characteristic length as the first superelement.

19. The system of claim 15, wherein updating the volume for the master cell to include volumes for each of the first plurality of cells in the first superelement is accomplished using a Schur complement.

20. The system of claim 15, the operations further comprising:
reclassifying a first plurality of superelements, including the first superelement, as first reclassified cells;
marking the first reclassified cells as a first reclassified cell level; and
grouping the first reclassified cells into a first reclassified superelement.

* * * * *